United States Patent [19]

Ozaki et al.

[11] Patent Number: 4,820,549
[45] Date of Patent: Apr. 11, 1989

[54] PHOTO-CURABLE RESIST RESIN COMPOSITION FOR ELECTROLESS PLATING, PROCESS FOR PREPARING A PRINTED CIRCUIT BOARD WITH THE SAID RESIST RESIN COMPOSITION AND A PRINTED CIRCUIT BOARD HAVING RESIST PREPARED FROM THE SAID RESIST RESIN COMPOSITION

[75] Inventors: Kiyoshi Ozaki, Koshigaya; Atsushi Mori, Chiba; Hideo Tsuda, Abiko; Mineo Kawamoto, Hitachi; Kanji Murakami, Mito; Motoyo Wajima, Hitachi, all of Japan

[73] Assignee: Hitachi, Ltd., Tokyo, Japan

[21] Appl. No.: 51,518

[22] Filed: May 19, 1987

[30] Foreign Application Priority Data

May 20, 1986 [JP] Japan ................... 61-115141

[51] Int. Cl.$^4$ ............................................. B05D 5/12
[52] U.S. Cl. ........................................ 427/98; 427/96; 427/306
[58] Field of Search .................... 427/98, 96, 306; 428/901; 361/397

[56] References Cited

U.S. PATENT DOCUMENTS

| | | | |
|---|---|---|---|
| 3,307,972 | 3/1967 | Ehrhardt | 427/98 |
| 4,216,246 | 8/1980 | Iwasaki | 427/98 |
| 4,297,401 | 10/1981 | Chern | 428/1 |
| 4,401,537 | 8/1983 | Chern | 428/1 |
| 4,550,128 | 10/1985 | Chellis | 428/901 |
| 4,572,764 | 2/1986 | Fan | 427/98 |
| 4,590,539 | 5/1986 | Sanjana | 428/901 |
| 4,599,268 | 7/1986 | Chellis | 428/901 |
| 4,689,442 | 8/1987 | Ozaki | 361/397 |

FOREIGN PATENT DOCUMENTS 0124292 11/1984 European Pat. Off. .

Primary Examiner—Shrive Beck
Assistant Examiner—Vi Duong Dang
Attorney, Agent, or Firm—Antonelli, Terry & Wands

[57] ABSTRACT

A photo-curable resist resin composition for electroless plating comprising an epoxy resin having a viscosity of at least 150 poises at 25° C., and at least two glycidyl ether groups in one molecule, the glycidyl ether groups being directly bonded to the aromatic ring as Component A, an oxirane ring-containing compound having a boiling point of at least 140° C. and a molecular weight of not more than 500 as Component B, and a photo-sensitive aromatic onium salt as Component C, wherein the Component A is in an amount of 90 to 40 parts by weight per total 100 parts by weight of the Components A and B, and the Component C is in an amount of 0.1 to 5 parts by weight per total 100 parts by weight of the Components A and B, and, if any, other resin components, can produce a resist film capable of withstanding highly alkaline electroless copper plating solution at a high temperature for a long time without any decrease in the physical properties of plating films deposited even by repeated use of the electroless copper plating solution. The resist film prepared from the resist resin composition has distinguished soldering heat resistance, solvent resistance and electrical insulation.

3 Claims, 2 Drawing Sheets

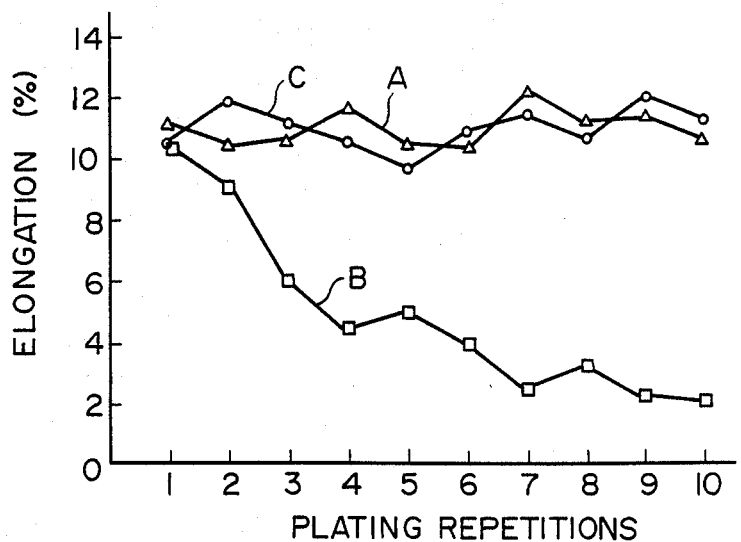
F I G. 1
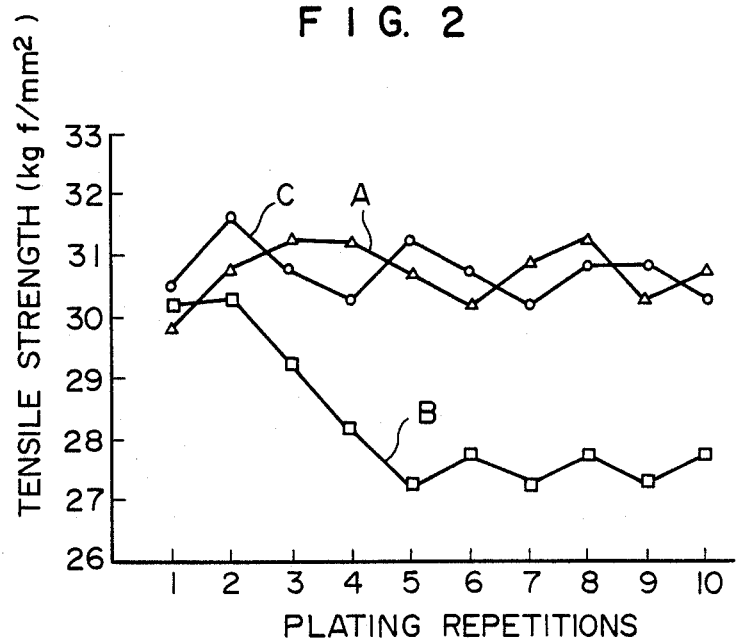
F I G. 2

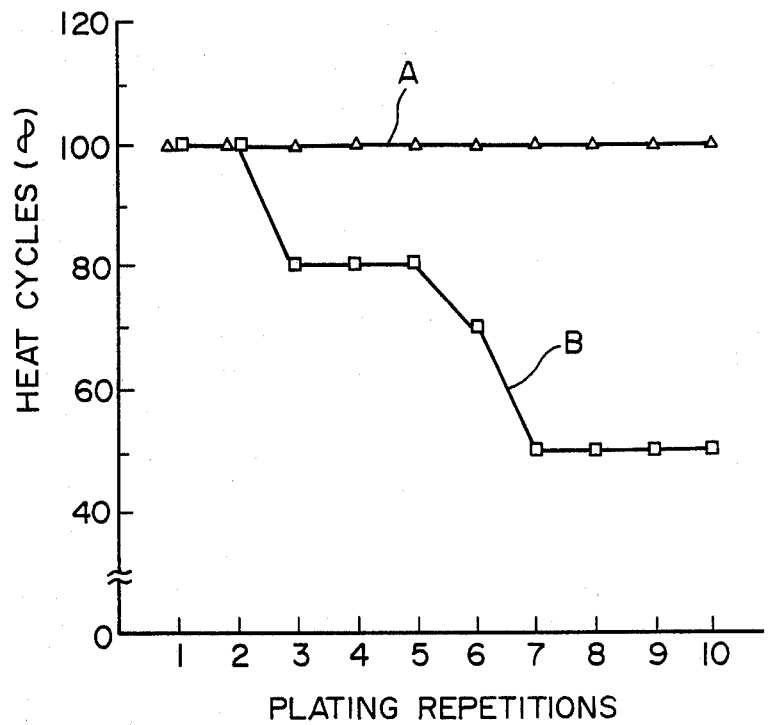

PHOTO-CURABLE RESIST RESIN COMPOSITION FOR ELECTROLESS PLATING, PROCESS FOR PREPARING A PRINTED CIRCUIT BOARD WITH THE SAID RESIST RESIN COMPOSITION AND A PRINTED CIRCUIT BOARD HAVING RESIST PREPARED FROM THE SAID RESIST RESIN COMPOSITION

BACKGROUND OF THE INVENTION

This invention relates to a novel, photo-curable resist resin composition, more particularly to a novel resist resin composition based on photo-cationic polymerization containing epoxy resin as the main curable component, and also to a process for preparing a printed circuit board by full additive or partly additive procedure for forming a necessary circuit on an insulating substrate only by electroless plating using the said novel photo-curable resist resin composition, and to a printed circuit board having a resist prepared from the said novel photo-curable resist resin composition.

The cured product of the present resist resin composition has distinguished characteristics against an electroless plating solution, and thus is suitable as a resist for electroless plating to produce a printed circuit board by full additive or partly additive procedure including a step for forming a circuit by electroless plating (both the full additive procedure and the partly additive procedure will be hereinafter referred to as "full additive procedure").

A process for preparing a printed circuit board by a subtractive procedure for forming a circuit on both face and back sides of a substrate and throughhole electroconductive platings by electroless plating, electrolytic plating and etching together has been so far known. On the other hand, the full additive procedure for forming all the circuits and throughhole electroconductive platings only by electroless plating has been recently practically utilized. That is, so many processes for preparing a printed circuit board by the full additive procedure for forming a circuit on an insulating substrate as a starting material only by electroless plating have been proposed, typical of which are the processes proposed by some of the present inventors (Japanese Patent Publication No. 58-30760 and 60-5079), where an adhesive layer is provided on an insulating substrate, the surface of the adhesive layer is roughened or alkali-treated, a noble metal catalyst for electroless plating reaction is provided on the surface, then a resist is provided on other parts than the circuit-forming part, and a circuit is formed on the circuit-forming part by electroless plating.

A process for producing a printed circuit board by the full additive procedure for forming a circuit with an electroless copper plating solution uses a plating solution capable of depositing a plating film having distinguished physical properties such as high elongation and tensile strength. Many such electroless copper plating solutions have been so far proposed. For example, some of the present inventors proposed such an electroless plating solution (Japanese Patent Publication No. 56-27594).

Such electroless copper plating solutions are subjected to plating usually in a strongly alkali state (pH 11.0 to 13.5 at 20° C.) and at a higher temperature of 60° to 80° C. The plating film deposition rate of the electroless copper plating solutions is about 1 to 6 $\mu$m/hr, and thus it takes 5-30 hours to form a circuit having a thickness of 30 $\mu$m.

Thus, the plating resist for use in the full additive procedure, i.e. a film formed at other parts than the circuit-forming part on the additive layer surface must withstand exposure to the said strongly alkaline electroless plating solution at a high temperature and further must make no dissolution of a portion of the components from the resist, thereby preventing the electroless copper plating solution from contamination and from the consequent decrease in the deposition rate or from the consequent deterioration of the physical properties of plating film. Furthermore, the plating resist is used as a permanent mask, and thus must have sufficient soldering heat resistance, solvent resistance and electrical insulation.

As a plating resist for the full additive procedure that can satisfy these requirements, a screen printing ink of heat-curing type containing epoxy resin as the main component is used, typical of which is that disclosed by some of the present inventors in Japanese Patent Application Kokai (Laid-open) No. 54-13574, or also in the said Japanese Patent Publication Nos. 58-30760 and 60-5079. However, these plating resists require such conditions as 130° to 150° C. for 20 to 40 minutes for curing. Thus, a plating resist of ultraviolet curing type, which can be cured for a few seconds, has been recently in demand.

As resist resin compositions of ultraviolet curing type, solder resists based on radical polymerization are disclosed in Japanese Patent Applications Kokai (Laid-open) Nos. 59-51962, 59-89316, 59-12673, 59-213779, 59-213779, etc., and are also commercially available as a screen printing ink. Furthermore, a resist resin composition for electroless plating based on the radical polymerization is disclosed in Japanese Patent Application Kokai (Laid-open) No. 60-121443. That is, the resist composition disclosed in Japanese Patent Application Kokai (Laid-open) No. 60-121443 comprises an unsaturated compound having at least two double bonds at the terminals as an oligomer such as epoxyacrylate and epoxymethacrylate having acryloyl groups or methacryloyl groups, an unsaturated compound having a double bond at the terminal as a monomer, such as monofunctional or multifunctional acrylate and methacrylate compounds, a photo polymerization initiator, and an organic compound having a thio or dithio group. This plating resist of ultraviolet curing type is characterized by no deposition of platings onto the resist film owing to the presence of the compound having a thio or dithio group as contained. The curing reaction is based on radical polymerization, where the oligomers and monomers undergo polymerization through the radicals produced by the photo polymerization initiator by irradiation of ultraviolet rays.

Furthermore, since photosensitive aromatic onium salts are disclosed as a photo polymerization catalyst for the epoxy resin [Japanese Patent Applications Kokai (Laid-open) Nos. 50-151996, 50-151997 and 50-158680], many photo-sensitive compounds of photo cationic type and resin compositions based on photo cationic polymerization containing epoxy resin as the main curable component and these photo-sensitive compounds as a photo polymerization catalyst have been proposed. In these proposals much diversified uses such as a protective film, an insulating film, a printing ink, a photo resist, etc. are disclosed, but there have been no literatures teaching their use as a resist for electroless plating.

As described above, the resist of heat curing type can be applied by screen printing, but requires much time in curing and also has a low resolving power owing to the running of a printed resist film when heated for curing.

On the other hand, the resist of ultraviolet curing type has a very short curing time and thus has a possibility to solve the problems of the said resist of heat curing type. However, the conventional plating resist of ultraviolet curing type still has many points to improve, such as internal curing property at the curing, and leveling, luster, pinholes, blurring, etc. or printed resist films. Furthermore, the insulation resistance after the plating or moisture resistance test is lower than that of the resist of heat curing type. Still furthermore, uncured monomer components or decomposition components formed by hydrolysis of the ester groups are dissolved from the cured resist film into the plating solution and thus contaminate the plating solution. That is, the conventional plating resist of ultraviolet curing type cannot be used in the production of a printed circuit board according to the full additive procedure.

That is, the present inventors have made extensive studies of the conventional plating resist of ultraviolet curing type based on radical polymerization, and have found that the resist film formed on the insulating substrate by application and successive ultraviolet curing can withstand the highly alkaline electroless copper plating solution at the high temperature only in appearance, but has problems of physical properties of the deposited plating film. Specifically, plating operation is carried out for a duration of 10 hours with an exposed resist area of 200 cm$^2$ per 1 of an electroless copper plating solution while supplying consumed components to the plating solution, and this operation is repeated with a fresh resist of the same exposed area but without changing the plating solution, i.e. with the initially charged plating solution. Decrease in the elongation and tensile strength of the deposited plating film occurs at the 3rd and 4th repetitions of plating operation. It has been further found in the heat cycle test of the printed circuit boards obtained after the individual repetitions of the plating operation that the printed circuit boards obtained at the 3rd and 4th repetitions of plating operation with the initially charged plating solution have cracks developed in the throughhole parts with smaller number of heat cycles, as compared with the printed circuit boards obtained at the 1st and 2nd repetitions, and thus have a poor reliability. It seems that unreacted oligomers or monomer components are dissolved into the plating solution from the resist film during the plating operation and accumulated therein, changing the structure of the deposited plating film.

These problems can be solved by replacing the initially charged plating solution with a fresh plating solution entirely after every plating operation or after the 2nd repetitions of the initially charged plating solution, but this procedure is commercially disadvantageous from the viewpoint of mass-production efficiency of printed circuit plates. That is, it is highly desirable to use an electroless copper plating solution repeatedly while supplementing the plating solution with the consumed components.

SUMMARY OF THE INVENTION

An object of the present invention is to provide a novel resist resin composition for electroless plating containing an epoxy resin of ultraviolet curing type as the main curable component, which can form a resist film capable of withstanding the said vigorous conditions imposed by an electroless copper plating solution.

Another object of the present invention is to provide a novel resist resin composition of ultraviolet curing type for electroless plating, which can form a resist film capable of withstanding a highly alkaline electroless copper plating solution at a high temperature for a long time and without any decrease in the physical properties of deposited plating films even after repeated use of the plating solution, and having distinguished soldering heat resistance, solvent resistance, and electrical insulation required as a permanent mask.

Other subject of the present invention is to provide a process for producing a printed circuit board of high reliability, using such a novel resist resin composition of ultraviolet curing type for electroless plating.

Further object of the present invention is to provide a printed circuit board of high reliability having a resist prepared from such a novel resist resin composition of ultraviolet curing type for electroless plating.

As a result of extensive studies to attain the said objects, the present inventors have found that the resist formed from a resin composition based on photo cationic polymerization using a photo-sensitive aromatic onium salt as a photo polymerization initiator, which contains an epoxy compound with functional groups directly connected to the aromatic ring as the main curable component has much distinguished properties against an electroless copper plating solution.

The present invention provides a photo-curable resist resin composition for electroless plating, which comprises:

an epoxy resin having a viscosity of at least 150 poises at 25° C., and at least two glycidyl ether groups in one molecule, the glycidyl ether groups being directly bonded to the aromatic ring, as Component A, an oxirane ring-containing compound having a boiling point of at least 140° C. and a molecular weight of not more than 500 as Component B, and a photo-sensitive aromatic onium salt as Component C.

In the present photo-curable resist resin composition, the Component A is in an amount of 90 to 40 parts by weight per total 100 parts by weight of the components A and B, and the component C is in an amount of 0.1 to 5 parts by weight per total 100 parts by weight of the components A and B, and, if any, other resin components.

That is, the present resist resin composition for electroless plating is directed to use in formation of a necessary resist for electroless copper plating in the production of printed circuit boards by full additive procedure and includes resin compositions based on photo cationic polymerization, adjusted to such preparations as resist ink, etc.

The epoxy resin as the said component A is a multifunctional epoxy resin having at least two glycidyl ether groups in one molecule such as bisphenol A type epoxy resin, bisphenol F type epoxy resin, phenol novolak type epoxy resin, cresol novolak type epoxy resin, hydrogenated bisphenol A diglycidyl ether resin, etc. These epoxy resins have a high photo curability and thus can produce a tough thin cured film (resist) having a high cross-linking density. Furthermore, they have no hydrolyzable bonds such as ester bonds, etc. in the main chains, and thus the thin cured film is very stable against an electroless copper plating solution. Furthermore, these epoxy resin are generally highly viscous liquids or solids at the ordinary temperature, and have a low dependency of the viscosity upon the temperature at the ordinary temperature. Thus, the viscosity is adjusted with an appropriate diluent to make a resin composition having good thin film-forming characteristics and printing characteristics when used as a screen printing ink.

A bisphenol A type epoxy resin and a novolak type epoxy resin having a viscosity of at least 150 poises at 25° C. can be preferably used as Component A from the practical viewpoint. Particularly, an epoxy resin having a viscosity of less than 150 poises at 25° C., that is, an epoxy resin having a low molecular weight and a low epoxy equivalent can produce a tough thin film which, however, has defects such as cissing, etc. and thus it is difficult to form a smooth and flat thin film therefrom. In the case of a screen printing ink, the viscosity is so low and dependent upon the temperature that the resolving power is lowered owing to blurring, cissing, sagging, running, etc. during the printing. Thus, no thin cured film capable of satisfying the desired properties as a plating resist can be obtained only by the single use of the epoxy resin of low molecular weight.

On the other hand, the multifunctional novolak type epoxy resin can produce a film having a high cross-linking density and a thickness of 10 to 100 μm owing to the good internal curability. Furthermore, a tough film can be obtained at a high curing rate, and thus the novolak type epoxy resin can be preferably used in the present invention.

It is not preferable to use aliphatic epoxy resins having less than two oxirane rings in one molecule, such as alicyclic epoxy resin, glycidyl ester-based epoxy resin, glycidylamine-based epoxy resin, heterocyclic epoxy resin, epoxidized polybutadiene, etc., because the cured films of these epoxy resins are partially dissolved in an electroless copper plating solution or deteriorated when dipped in the plating solution owing to the influence of hydrolyzable groups such as ester bonds, etc. or owing to the low cross-linking density, and particularly those having amino groups contaminate the plating solution, lowering the deposition rate or the elongation or the tensile strength of the plating film. Thus, it is not preferable to use these epoxy resins.

Epoxy resin for use in the present invention as Component A includes the following commercially available products: (1) Bisphenol A type epoxy resin
- (a) Epikote 826, 827, 828, 830, 834, 836, 840, 1001, 1002, 1004, 1007, 1009, 1010, X-22, X-24, and X-25 (trademarks of products made by Yuka Shell Epoxy K.K., Japan),
- (b) Araldite GY250, GY252, GY260, GY280, 6004, 6005, 6010, 6020, 6030, 6040, 6060, 6071, 6075, 6084, 6097, 7065, 7071, 7072, and 7097 (trademarks of products made by Ciba-Geigy Corp., Switzerland),
- (c) DER 330, 331, 332, 337, 557, 660, 661, 662, 664, 668, and 669 (trademarks of products made by Dow Chemical Co., USA),
- (d) Epiklon 840, 850, 855, 857, 860, 1050, 3050, 4050 and 7050 (trademarks of products made by Dainippon Ink Kagaku Kogyo K.K., Japan),
- (e) Epotoho YD-127, YD-128, YD-128S, YD134, YD-011, YD-012, YD-014, YD-017, YD-019, YD-020, YD-7011, YD-7014, YD-7017, YD-7019, YD-7020, YD-7126, YD-7128, and YD-8125 (trademarks of products made by Toto Kasei Kogyo K.K., Japan),
- (f) Bakelite ERL-2200, ERL-2400, ERL-2710, ERL-2772, ERL-2774, ERLA-2600, EKR-2002, EKR-2003, EKRB-2010, EKRA-2018, and EKRA-2053 (trademarks of products made by Union Carbide Corp., USA),
- (g) Epilit 508, 509, 510, 515-B, 520-C, 522-C, 530-C, 540-C, 550, 560 and 5108 (trademarks of products made by Celaness Corp., USA),
- (h) Epotuf 37-139, 37-140, 37-141, 37-144, 37-300, 37-301, 37-302, 37-304, 37-307 and 37-309 (trademarks of products made by Richard Chemical Co., USA),
- (i) Epomik R-128, R-130, R-139, R-140, R-144, R-301, R-302, R-304, R-307 and R-309 (trademarks of products made by Mitsui Sekiyu-Kagaku Epoxy K.K., Japan),
- (j) Adekaresin EP-4100, EP-4200, EP-4300 and EP-4400 (trademarks of products made by Asaki Denka Kogyo K.K., Japan), and
- (k) Asahi Epoxy Resin AER-330, 331, 334, 337, 661, 664, 667, 669 and 711 (trademarks of products made by Asahi Kasei Kogyo, K.K., Japan)

Bisphenol A type epoxy resin may be represented by the following formula:

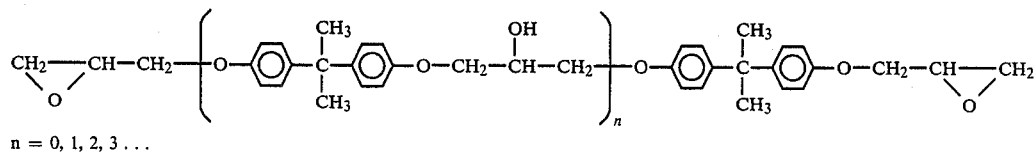

n = 0, 1, 2, 3 . . .

The molecular weight, epoxy equivalent and viscosity depend upon the number of n, and the epoxy resin given with the trademarks in paragraphs (a) to (k) include liquid and solid resins and have epoxy equivalents of 170 to 6000 (eq/g). Liquid epoxy resin has a viscosity (P/25° C.) of about 7 to about 350 and solid epoxy resin has a viscosity of A to $Z_5$ according to Gardner-Holdt procedure and a melting point of 20° to 180° C.

(2) Bisphenol F type epoxy resin
- (a) Epikote 807 (trademark of product made by Yuka Shell Epoxy, K.K., Japan),
- (b) Epoto YDF-170, YDF-190, YDF-2001, YDF-2004 and YDF-2007 (trademarks of products made by Toto Kasei Kogyo K.K., Japan),
- (c) Epiklon 830 and 831 (trademarks of products made by Dainippon Ink Kagaku Kogyo K.K., Japan), and
- (d) Epomik R-114 (trademark of product made by Mitsui Sekiyu-Kagaku Epoxy K.K., Japan).

Bisphenol F type epoxy resin may be represented by the following formula:

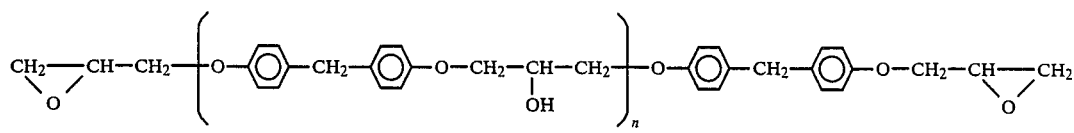

n = 0, 1, 2, 3 ...

The molecular weight, epoxy equivalent and viscosity depend upon the number of n, and the epoxy resin given with the trademarks in paragraphs (a) to (d) include liquid and solid resins and have epoxy equivalents of 160 to 2,100 (eq/g). Liquid epoxy resin has a viscosity of about 20 to 120 (P/25° C.) and solid epoxy resin has a viscosity of B to W according to Gardner-Holdt procedure.

(3) Novolak type epoxy resin
 (a) Epikote 152 and 154 (trademarks of products made by Yuka Shell Epoxy K.K., Japan),
 (b) DEN-431, 438 and 439 (trademarks of products made by Dow Chemical Co., USA),
 (c) Araldite EPN-1138, EPN-1139, and ECN-1235, 1273, 1230 and 1299 (trademarks of products made by Ciba-Geigy Corp., Switzerland),
 (d) Epiklon N-673, N-680, N-695 and N-740 (trademarks of products made by Dainippon Ink Kagaku Kogyo K.K., Japan),
 (e) EOCN-102, 103 and 104 (trademarks of products made by Nihon Kayaku K.K., Japan),
 (f) Epototo YDPN-601, YDPN-602, YDPN-638, YDCN-701, YDCN-702, YDCN-703 and YDCN-704 (trademarks of products made by Toto Kasei Kogyo K.K., Japan),
 (g) ERR-0100, and ERLB-0447 and 0448 (trademarks of products made by Union Carbide Corp., USA),
 (h) Epi-Rez 5155 and 5156 (trademarks of products made by Celanese Corp., USA), and
 (i) Epotuf 37-170 (trademarks of products made by Richard Chemical Co., USA).

Novolak type epoxy resin includes a phenyl-novolak type resin represented by the following formula:

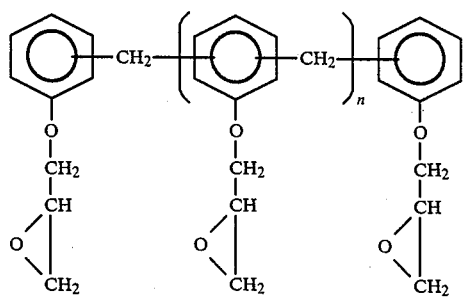

n = 0, 1, 2, 3 ...

and a cresol-novolak type resin represented by the following formula:

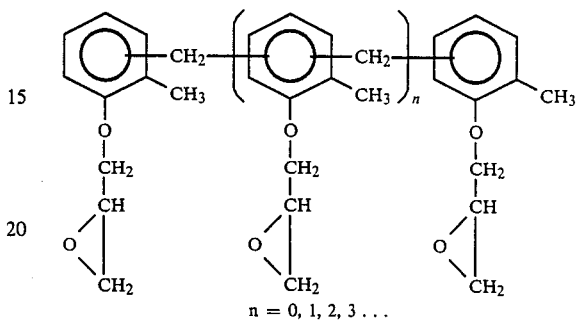

n = 0, 1, 2, 3 ...

The molecular weight, epoxy equivalent and viscosity depend upon the number of n and the epoxy resins have epoxy equivalents of 170 to 250 (eq/g). Liquid epoxy resin has a viscosity of 14 to 1,000 (P/25° C.), and solid epoxy resin has a viscosity of A to K according to Gardner-Holdt procedure and a melting point of 35° to 100° C.

(4) Hydrogenated Bisphenol A diglycidyl ether resin
 (a) Adeka resin EP-4080 (trademark of product made by Asaki Denka Kogyo K.K., Japan),
 (b) Epiklon 750 (trademark of product made by Dainippon Ink Kagaku Kogyo K.K., Japan), and
 (c) Eptoto ST-1000, ST-3000, ST-5080 and ST-5100 (trademarks of products made by Toto Kasei Kogyo K.K., Japan).

Beside those enumerated above, epoxy resins containing the resins obtained by condensation of, for example, resorcinol, bisphenol F, phloroglicinol, and other phenolic compounds as skeletons and having at least two glycidyl ether groups in one molecule can be also used.

Various epoxy resins enumerated above can be used alone or in a mixture of at least two thereof as Component A.

In the present invention, the oxirane ring-containing compound as Component B is used as reactive diluent for dissolving the epoxy resin as Component A and adjusting the viscosity of the resist resin composition. oxirane ring-containing compounds having a boiling point of less than 140° C. are liable to evaporate during the preparation of the resin composition, changing the mixing ratio of the composition. That is, it is difficult to prepare a desired resist resin composition therefrom. Furthermore, oxirane ring-containing compounds having a molecular weight of more than 500 have a higher viscosity by themselves, and thus cannot be used for adjusting the viscosity of the resist resin composition.

The oxirane ring-containing compound for use in the present invention includes, for example, epoxy monomers, and bisphenol A type epoxy resin, bisphenol F type epoxy resin, novolak type epoxy resin, hydrogenated bisphenol A type epoxy resin, etc. having a low viscosity and a low molecular weight, which can be used alone in a mixture of at least two thereof. It is particularly preferable to use epoxy monomers as Component B, since the epoxy monomers have a good compatibility with the epoxy resin as Component A, and thus can adjust the viscosity of a resist resin composition with a minimum amount of the epoxy monomers, and also they have a reactivity by themselves and thus can suppress the deterioration of the properties by the diluent to a minimum. Furthermore, by selecting an epoxy monomer having a photo cationic polymerization similar to that of the epoxy resin as Component A, uniform polymerization reaction can be made to take place, suppressing any local reaction and side reactions. As a result, curing only on the film surface can be prevented, and even in the case of a film having a thickness of 10 to 100 μm, curing can be carried out uniformly to the inside, i.e. throughout the film.

The epoxy monomer for use in the present invention as Component B includes, for example, butylglycidyl ether, allylglycidyl ether, 2-ethylhexylglycidyl ether, phenylglycidyl ether, p-tertiarybutylphenylglycidyl ether, glycerineglycidyl ether, ethyleneglycol diglycidyl ether, dipropyleneglycol diglycidyl ether, neopentylglycol diglycidyl ether, 2-methyloctylglycidyl ether, glyceroltriglycidyl ether, trimethylolpropane polyglycidyl ether, etc. It is particularly preferable to use glycidyl ethers having an aromatic ring, because they have good reactivity, dilutability, and volatility and can produce a resin composition having good printing characteristics when prepared into a screen printing ink.

Other monomers having a cationic polymerization activity than the oxirane ring-containing compounds, for example, olefin monomers, cyclic ethers of at least 4-membered ring, acetals, cyclic thioethers, cyclic lactones, bicyclic ethers, etc. generally have a low boiling point so that a stable resist resin composition is hard to prepare, and they have a strong odor and deteriorate the emulsion of printing screen. Furthermore, these monomers generally have a higher cationic polymerization activity than that of the epoxy resin as Component A, so that these monomers and the epoxy resin as Component A undergo polymerization at different polymerization rates, respectively, and no well cured film can be obtained. Thus, it is not preferable to use these monomers.

The photo-sensitive onium salt for use in the present invention is a photo polymerization initiator that releases a Lewis acid by irradiation of an activating energy beam such as visible light, ultraviolet rays, etc. to start the cationic polymerization of epoxy members, and includes, for example, such well known photo-sensitive aromatic onium salts as aromatic onium salt of the group VIIa elements (Japanese Patent Publication No. 52-14277), aromatic onium salts of the group VIa elements (Japanese Patent Publication No. 52-14279), etc. Specifically, triphenylphenacylphosphonium tetrafluoroborate, triphenylsulfonium hexafluoroantimonate, diphenyliodonium tetrafluoroborate, etc. can be used as Component C.

In the present photo-curable resist resin composition for electroless plating, a mixing ratio of the said Components A, B and C depends upon its modes of application, and when the resist resin composition is used as a screen printing ink, the resist resin composition comprises 90 to 40 parts by weight of Component A and 10 to 60 parts by weight of Component B per total 100 parts by weight of Components A and B, and 0.1 to 5 parts by weight of Component C per total 100 parts by weight of Components A and B, and, if any, other resin components, and has a viscosity of 50 to 300 poises at 25° C.

When the mixing ratio of component B is smaller, the effect of dilution upon the viscosity adjustment will be lower and thus a screen printing ink having a good viscosity is hard to obtain. When the mixing ratio of Component B is larger on the other hand, the viscosity will be so low as to cause blurring, and owing to a low cross-linking density, only a brittle cured film having a low surface hardness is obtained.

When the mixing ratio of Component C is smaller than the said lower limit, curing by the activating energy beam becomes insufficient, and cured film that can satisfy the desired hardness, resistance to electroless copper plating solution, electrical characteristics, moisture barrier characteristics, etc. cannot be obtained. When the mixing ratio of Component C is larger than the said upper limit, only the film surface is cured, while the inside remains in an uncured state, causing creases. Furthermore, a large amount of photolytic products of the aromatic onium salt formed by the photo irradiation remains in the cured film, causing contamination of the electroless copper plating solution and lowering the electrical characteristics of the cured film. A preferable mixing ratio of Component C is 0.5 to 4 parts by weight per total 100 parts by weight of Components A and B, and, if any, other resin components.

When the said resin composition is used as a screen printing ink in the present invention, other epoxy resins than those defined as Component A can be used to improve the general printing characteristics and film physical properties. The epoxy resin applicable together with Component A includes, for example, bisphenol A type epoxy resin, bisphenol F type epoxy resin, novolak type epoxy resin, hydrogenated bisphenol A type epoxy resin, etc. having a viscosity of less than 150 poises at 25° C., and can be used in an amount of less than 100 parts by weight per 100 parts by weight of the epoxy resin as Component A.

When the aromatic onium salt as Component C has an insufficient compatibility with the epoxy resin as Component A, the aromatic onium salt as dissolved in an appropriate solvent, such as acetonitrile, propylene carbonate, cellosolves, etc. can be added to the other resin components.

When the present resin composition is used as a screen printing ink as a means of printing the present resin composition to the surface of an insulating substrate, various additives are added thereto. These additives include a filler, a coloring agent, a defoaming agent, a levelling agent, etc.

The filler is used to improve the thixotropy, screen releasability, etc., and includes, for example, fine powders of silicon oxide, zirconium silicate, talc, quarts, etc. The coloring agent is used for easy checking after printing or curing or after circuit formation, and includes, for example, extender pigments such as alumina white, clays, barium sulfate, etc., inorganic pigments such as zinc white, ultramarine, prussian blue, titanium oxide, carbon black, etc., and organic pigments such as Brilliant Carmine 6B, Permanent Red R, Benzidine Yellow, Phthalocyanine Blue, Phthalocyanine Green, etc. These organic pigments are represented by the following formulae:

(1) Brilliant Carmine 6B

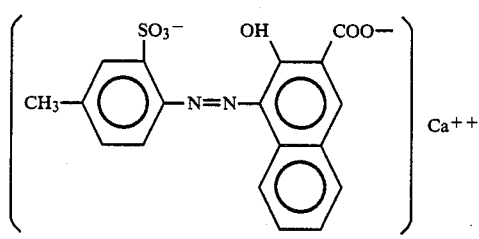

(2) Permanent Red R + Permanent Red 4R

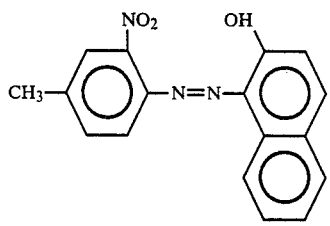

(3) Benzidine Yellow

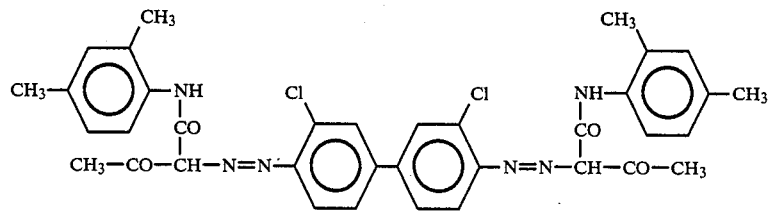

(4) Phthalocyanine blue + Phthalocyanine Blue B

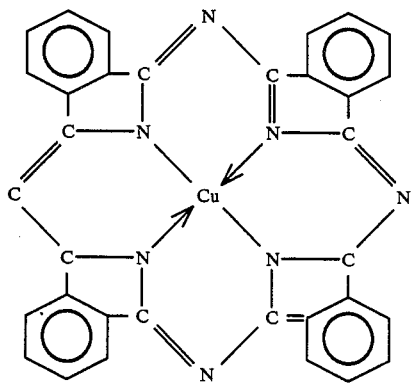

(5) Phthalocyanine Green

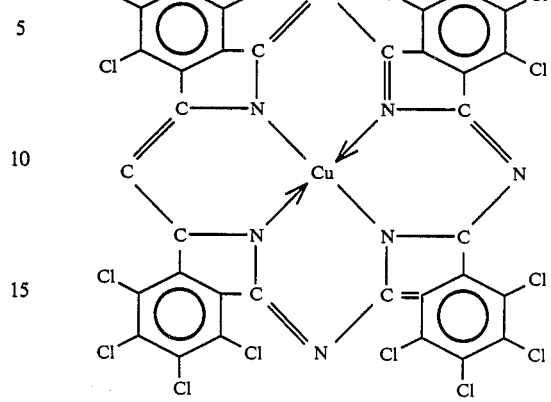

The defoaming agent is used to immediately destroy foams generated in the film right after the printing and is mainly silicone oil. The levelling agent is used to remove the defoamed remains or prevent formation of orange peel, and includes, for example, fluorine-based surfactants, silicone-based surfactants, silicone-modified epoxy resin, non-aqueous acrylic copolymers, etc. In addition, various coupling agents based on aluminium chelates or titanates can be contained in the resin composition to improve the adherence of the resin components to the filler, etc.

Preferable mixing ratios of these additives per total 100 parts by weight of Components A, B and C are 1 to 25 parts by weight of one or more of the fillers, 0.5 to 10 parts by weight of one or more of the coloring agents, 0.5 to 4 parts by weight of the defoaming agent, 0.5 to 5 parts by weight of one or more of the levelling agents, and 1 to 5 parts by weight of the coupling agent, when used.

These additives are added to a composition composed of the said Components A, B and C, preliminarily kneaded in a kneader, and further kneaded through three rolls to obtain a plating resist ink of ultraviolet curing type for screen printing. The ink will be screen printed onto other parts than the circuit-forming part on an insulating substrate for a printed circuit board, as will be described later. The printed film can be cured by irradiation of ultraviolet rays having a wavelength of 200 to 500 nm, or of the ultraviolet ray and a visible light or far infrared rays. As a source for these activating energy beams, a low pressure mercury lamp, a high pressure mercury lamp, an ultra-high pressure mercury lamp, a metal halide lamp, an argon laser, etc. can be used. Furthermore, X-rays, electron beams, etc. can be used as the activating energy beams.

The present resin composition can be thoroughly cured only by irradiation of the said activating light or energy beams, and a cured film having the desired characteristics can be obtained. By leaving the cured film to stand in a heating chamber after the photo curing, the cured film can have better characteristics. The conditions for leaving a cured film in a heating chamber is usually a duration of 2 to 20 hours at 50° to 80° C.

As described above, the present resin composition can produce a very stable cured film against an electroless copper plating solution under severe conditions through a combination of a selected epoxy resin as Component A and a selected oxirane ring-containing compound as Component B. That is, a cured film having distinguished characteristics against an electroless copper plating solution can be obtained owing to the following effects as synergistically attained:

(a) Component A is an epoxy resin having many functional groups and has a high photo-cationic polymerization activity, and thus a tough cured film having a high cross-linking density can be formed.

(b) Component A is an epoxy resin having no hydrolyzable groups in the skeleton, and thus a cured film less decomposable by an electroless copper plating solution can be formed.

(c) Component B is an oxirane ring-containing compound having a good compatibility with the epoxy resin as Component A, and can adjust the viscosity of the resin composition with a necessary minimum amount thereof, and thus the characteristics of the epoxy resin as Component A are not lowered.

(d) Component B is an oxirane ring-containing compound having a photo-cationic polymerization activity similar to that of the epoxy resin as Component A, and thus the polymerization reaction rates of Components A and B can be made equal to each other, so that the polymerization reaction can proceed uniformly to form a uniformly cured film. Thus, the present invention can provide a resist having a good resolving power free from the printing defects such as blurring, cissing, sagging, running, etc., when used as a screen printing ink for electroless copper plating on the basis of the said distinguished effects.

Description will be made below of a process for producing a printed circuit board, using the present resin composition as a resist ink for electroless plating.

As an insulating substrate for printed circuit boards, various laminated boards such as a paper phenol board, a paper epoxy board, a composite board, a glass epoxy board, a polyimide board, etc. or these boards provided with a noble metal catalyst for electroless plating can be used. Generally, the said laminated board, as coated with a well known thermo-setting adhesive composed of epoxy resin, phenol resin, acrylonitrilebutadiene rubber, a vulcanizing agent, a vulcanizing accelerator, a filler and a solvent on one side or both sides thereof, can be used as a starting material. The adhesive can contain a noble metal catalyst for electroless plating.

In the case of using laminated board and an adhesive containing no noble metal catalyst for electroless plating, a printed circuit board can be produced in the following two manners:

(1) The adhesive layer on the laminated board surface is chemically roughened, a noble metal catalyst is provided on the entire surface of the chemically roughened adhesive layer, then the said plating resist ink of ultraviolet curing type is screen printed on the other parts than the circuit-forming part and cured, and then a circuit is formed by electroless copper plating.

(2) The said plating resist ink of ultraviolet curing type is screen printed on the other parts than the circuit-forming part on the adhesive layer surface of a laminated board and cured, then the adhesive exposed on the circuit-forming part is chemically roughened, a nobel metal catalyst is provided on the entire surface of the laminated board, then the catalyst on the resist film is removed, and a circuit is formed by electroless copper plating.

In the case of both the laminated board and the adhesive containing a nobel metal catalyst, a printed circuit board can be produced in the following two manners:

(3) An adhesive layer on the surface of the laminated board is chemically roughened, then the said plating resist ink of ultraviolet curing type is screen printed on the other parts than the circuit-forming part and cured, and then a circuit is formed by electroless copper plating.

(4) The said plating resist ink of ultraviolet curing type is screen printed on the other parts than the circuit-forming part on the adhesive surface on a laminated plate and cured, then the exposed adhesive layer on the circuit-forming part is chemically roughened, and then a circuit is formed by electroless copper plating.

In any of the said four manners (1) to (4), a printed circuit board with printing on both sides and throughholes can be produced only by providing throughholes at the required positions of a laminated board provided with an adhesive layer, and also a printed circuit board with printing only on one side and throughholes can be produced only by coating the entire surface on one side of a board with the said plating resist ink of ultraviolet curing type. However, the present process is not limited only to those four manners (1) to (4).

According to the present process for producing a printed circuit board, using the present plating resist ink of ultraviolet curing type the curing time can be considerably shortened, as compared with that for the conventional plating resist ink of heat curing type, and the cured resist film has a higher plating resistance than that of the conventional plating resist of ultraviolet curing type based on radical polymerization. Furthermore, the present resist film does not contaminate an electroless copper plating solution, and thus the electroless copper plating solution can be used with considerably increased number of repetitions. Thus, the present invention can provide a process for producing a printed circuit board stably with a good reliability on a mass-production scale.

BRIEF DESCRIPTION OF THE DRAWINGS

FIG. 1 is a diagram showing a relationship between the number of repetitions of an electroless copper plating solution and the elongation of deposited plating films.

FIG. 2 is a diagram showing a relationship between the number of repetitions of an electroless copper plating solution and the tensile strength of deposited plating films.

FIG. 3 is a diagram showing a relationship between the number of repetitions of an electroless copper plating solution and the reliability of throughholes of printed circuit boards.

PREFERRED EMBODIMENTS OF THE INVENTION

The present invention will be described in detail below, referring to Examples, but the present invention will not be limited only to the Examples.

In Examples, "parts" and "percentage" are by weight, unless otherwise specified.

EXAMPLE 1

Photo-curable resist resin compositions for electroless plating:

Resist resin compositions (A-1) to (A-6) as screen printing inks were prepared according to the present invention, using epoxy resin corresponding to Component A, oxirane ring-containing compounds corresponding to Component B, triphenylsulfonium hexafluoroantimonate as 1 50% solution in propylene carbonate as Component C, and various additives, and comparative resist resin compositions (CA-1) and (CA-2) were also likewise prepared.

Characteristics of Components A and B and other resin components used in the resist resin compositions (A-1) to (A-6) and the comparative resist resin compositions (CA-1) and (CA-2) are shown in Table 1, and mixing ratios of the components are shown in Table 2.

The individual inks were prepared by adding 3 parts of Component C to Components A and B in the amounts shown in Table 2, stirring the mixture to make a solution, then adding various additives shown in Table 2 to the solution, preliminarily kneading the mixture in a kneader for about one hour, and then further kneading the mixture through three rolls.

The inks (A-1) to (A-6) of the present invention and the comparative inks (CA-1) and (CA-2) prepared as screen printing inks were printed onto insulating substrates for full additive procedure, using a 305-mesh polyester screen having a pattern of 0.15 mm in both circuit width and circuit distance under a tension of 11 kg/cm$^2$, and the printed films were exposed to irradiation of two high pressure mercury lamps, each at 80 W/cm, for 10 seconds, and cured.

The insulating substrates for full additive procedure were prepared according to the disclosure of Japanese Patent Publication No. 58-30760 by coating both sides of a nonflammable phenol laminated board with a phenol-modified, acrylonitrile-butadiene rubber-based adhesive containing CaCO$_3$ powder, roughening the adhesive layer with a chronic-sulfuric acid mixture after curing, followed by water washing-alkali treatment-water washing-noble metal catalyst deposition-water washing-activation-drying, etc. successively.

Eight kinds of substrates having cured films prepared from the present inks (A-1) to (A-6) and the comparative inks (CA-1) and (CA-2), respectively, were dipped into 8 electroless copper plating solutions having the following same composition at 70° to 73° C. for 20 hours, respectively, while injecting air into the plating solutions. The bath load (ink area/l of the plating solution) was 200 cm$^2$/l during the plating.

Electroless copper plating solution

| | |
|---|---|
| Copper sulfate: | 10 g/l |
| Ethylenediamine tetracetic acid: | 30 g/l |
| 37% formaldehyde solution (Formalin): | 3 ml/l |
| Polyethylene glycol (molecular weight: 600): | 200 ml/l |
| α-α' dipyridyl: | 35 mg/l |
| Sodium hydroxide: such an amount as to make pH 12.8 (at 20° C.) | |
| Water: such an amount as to make the entire solution 1 l | |

After the said substrates had been taken out from the plating solution, stainless steel plates that had been subjected to a noble metal treatment were dipped in the respective electroless copper plating solutions and kept to stay therein for 12 hours, while supplying to the plating solutions the copper sulfate, sodium hydroxide and 37% formaldehyde solutions as consumable components of the electroless copper plating solutions to deposit copper plating films on the stainless steel plates. Then, the deposited copper plating films were peeled off the respective stainless steel plates and subjected to determination of the deposition rate, and the elongation and the tensile strength of the plating films and evaluate the contamination tendency of the plating solutions with the cured resist films.

The evaluation was carried out in the following manner, and the results are shown in Table 3.

(a) Appearance of printed, cured films

Smoothness, luster and cissing of the printed, cured films were visually observed. Furthermore, blurring and resolving power thereof were observed with a microscope. The resolving power was determined whether both circuit width and circuit distance were maintained at 0.15 mm or not. These results of observances are shown by round mark "O" in Table 3 when these observation items except the resolving power were not found, and by cross mark "X" in Table 3 when found. The results of the resolving power are shown by round mark "O" in Table 3 when the circuit width and the circuit distance were maintained at 0.15 mm and by cross mark "X" in Table 3 when not.

(b) Plating solution resistance (i) Deterioration of cured films: After dipping in the electroless copper plating solution for 20 hours, the deterioration of the films were visually observed. Results of the deterioration are shown by round mark "O" in Table 3, when any deterioration was not found, and by cross mark "X" in Table 3 when found.

(ii) Surface insulation resistance; A comb type circuit pattern was formed on the resist film surfaces with an electroconductive paste according to FIG. 2 of Japanese Industrial Standard, JIS-Z-3197, and initial surface insulation resistances were measured with application of DC 500 V for one minute and surface insulation resistances were measured after moisture absorption tests at 40° C. and 95% relative humidity (RH) for 24 hours.

(iii) Adherence: The substrates with the resist films were placed in a solder bath at 260° C. for 10 seconds, and the resist films were cross-cut at 1 mm squares with a knife edge and subjected to peeling tests with an adhesive cellophane tape. Results are shown in Table 3 by way of the number of non-peeled squares per 100 squares.

(iv) Solvent resistance: The resist films were dipped in methylethylketone for 3 hours, and color changes of appearance and deterioration of the resist films were visually observed. The results are shown by round mark "O" in Table 3, when any color change and deterioration were found, and by cross mark "X", when not found. (c) Tendency to contaminate the electroless copper plating solution (i) Deposition rate of copper plating film was determined by measuring the weight of the deposited copper plating films at predetermined intervals and shown by their average deposition rate.

(ii) Elongation and tensile strength of the copper plating films were determined at a stretching rate of 2 mm/min. and the results are shown in Table 3.

TABLE 1

Characteristics of Resin Components

| Component No. | Resin Components | Number average molecular weight | Number of glycidyl ether group | Epoxy equivalent | Viscosity (poises at 25° C.) | Remarks |
|---|---|---|---|---|---|---|
| Component A | | | | | | |
| a-1 | Bisphenol A type epoxy resin | 900 | $\leq 2$ | 500 | Solid | Epikote 1001 |
| a-2 | Bisphenol A type epoxy resin | 1600 | $\leq 2$ | 880 | Solid | Epikote 1004 |
| a-3 | Phenol novolak type epoxy resin | 580 | $>3$ | 180 | Solid | Epototo YDPN638 |
| a-4 | Cresol novolak type epoxy resin | 450 | $<10$ | 220 | Solid | EOCN 103 |
| Component B | | | | | | |
| b-1 | p-t-butylphenylglycidyl ether | 206 | 1 | 226 | 0.23 | Dinakol EX 146, b.p. 120~130° C./4 mmHg |
| b-2 | Phenylglycidyl ether | 150 | 1 | 154 | 0.06 | Dinakol EX 141, b.p. 245° C. |
| b-3 | Bisphenol F type epoxy resin | 400 | $\leq 2$ | 190 | 100 | Epototo YDF-190, b.p. decomposed |
| b-4 | Hydrogenated bipshenol A type | 480 | $\leq 2$ | 230 | 25 | Epototo ST-3000, b.p. decomposed |
| b-5 | Bisphenol A-type expoxy resin | 370 | 2 | 185 | 100 | Epikote 828, b.p. decomposed |
| b-6 | 2-ethylhexylglycidyl ether | 186 | 1 | 200 | 0.03 | b.p. 102~107° C./8~9 mmHg |
| Other resin Component | | | | | | |
| X-1 | Alicyclic epoxy resin | 280 | $\leq 2$ | 135 | 4 | UVR-6110 b.p. 354° C. |
| X-2 | Bisphenol A type epoxy acrylate | — | — | — | 140 | SP-4010, made by Showa Kobunshi K.K., Japan |
| X-3 | Bifunctional acrylate | — | — | — | 6 | Aronix M-6250, made by Toa Gosei Kagaku Kogyo K.K., Japan |

TABLE 2

Photo-curable resist resin compositions for electroless plating (parts by weight)

| | Component A | | | | Component B | | | | | | Other resin component | | | Component C | Additive | | | | | | | Viscosity (poises at 25° C.) |
|---|---|---|---|---|---|---|---|---|---|---|---|---|---|---|---|---|---|---|---|---|---|---|
| | a-1 | a-2 | a-3 | a-4 | b-1 | b-2 | b-3 | b-4 | b-5 | b-6 | X-1 | X-2 | X-3 | C | Y-1 | Y-2 | Y-3 | Y-4 | Y-5 | Y-6 | Y-7 | |
| The Invention | | | | | | | | | | | | | | | | | | | | | | |
| A-1 | 70 | — | — | — | 30 | — | — | — | — | — | — | — | — | 3 | 2 | 5 | — | 5 | 1 | 1.5 | 2.5 | 300 |
| A-2 | — | — | 65 | — | 35 | — | — | — | — | — | — | — | — | 3 | 3 | 10 | 5 | — | 1 | 1.5 | 2.5 | 285 |
| A-3 | — | — | — | 65 | 35 | — | — | — | — | — | — | — | — | 3 | 3 | 5 | — | 5 | 1 | 1.5 | 2.5 | 295 |
| A-4 | — | — | 40 | — | 30 | — | 30 | — | — | — | — | — | — | 3 | 4 | 5 | 5 | — | 1 | 1.5 | 2.5 | 235 |
| A-5 | — | — | 40 | — | 20 | — | — | 30 | — | 10 | — | — | — | 3 | 4 | 10 | — | 5 | 1 | 1.5 | 2.5 | 250 |
| A-6 | — | 20 | 30 | — | 25 | 5 | — | — | 20 | — | — | — | — | 3 | 4.5 | 5 | 5 | — | 1 | 1.5 | 2.5 | 270 |
| Prior art | | | | | | | | | | | | | | | | | | | | | | |
| CA-1 | — | — | — | — | 35 | — | — | — | — | — | 65 | — | — | 3 | 3 | 5 | — | 5 | 1 | 1.5 | 2.5 | 110 |
| CA-2 | — | — | — | — | — | — | — | — | — | — | — | 30 | 70 | 4 | 3 | 5 | 5 | — | 1 | 1.5 | 2.5 | 145 |

Remarks:
(1) CA-2 is a photo radical-polymerizable composition containing benzyldimethylketal as Component C.
(2) Symbols for additive; Y-1: silicon oxide fine powder (filler), Y-2: Zirconium silicate (filler), Y-3: glass powder (filler), Y-4: talc (coloring agent), Y-5: phthalocyanine green (coloring agent), Y-6 silicone oil (defoaming agent), Y-7: acrylate ester copolymer (levelling agent)
(3) Viscosity; by Viscotester, type VT-04, No. 2 Rotor.

TABLE 3

| | Appearance of printed cured film | | | | | Deterioration of cured film | Plating solutions resistance | | Adherence | Solvent resistance | Tendency to contaminate plating solution | | Tensile strength kgf mm² |
|---|---|---|---|---|---|---|---|---|---|---|---|---|---|
| | | | | | | | Surface resistance ($\Omega$) | | | | Average deposition rate $\mu$m/hr | Elongation 70 | |
| Ink No. | Smoothness | Luster | Cissing | Blurring | Resolving power | | Initial | After moisture absorption | | | | | |
| The Invention | | | | | | | | | | | | | |
| A-1 | | | | | | | $7.1 \times 10^{14}$ | $6.5 \times 10^{14}$ | 100/100 | | 2.1 | 7.8 | 29.5 |
| A-2 | | | | | | | $9.5 \times 10^{14}$ | $9.0 \times 10^{14}$ | 100/100 | | 2.3 | 8.7 | 30.0 |
| A-3 | | | | | | | $9.1 \times 10^{14}$ | $8.8 \times 10^{14}$ | 100/100 | | 2.3 | 8.5 | 30.3 |
| A-4 | | | | | | | $7.3 \times 10^{14}$ | $7.1 \times 10^{14}$ | 100/100 | | 2.2 | 6.5 | 31.3 |
| A-5 | | | | | | | $8.1 \times 10^{14}$ | $6.9 \times 10^{14}$ | 100/100 | | 2.1 | 6.3 | 31.8 |
| A-6 | | | | | | | $7.0 \times 10^{14}$ | $6.1 \times 10^{14}$ | 100/100 | | 2.4 | 7.1 | 31.0 |

TABLE 3-continued

| Ink No. | Appearance of printed cured film | | | | | Deterioration of cured film | Plating solutions resistance | | Adherence | Solvent resistance | Tendency to contaminate plating solution | | |
| --- | --- | --- | --- | --- | --- | --- | --- | --- | --- | --- | --- | --- | --- |
| | Smoothness | Luster | Cissing | Blurring | Resolving power | | Surface resistance (Ω) | | | | Average deposition rate μm/hr | Elongation 70 | Tensile strength kgf mm² |
| | | | | | | | Initial | After moisture absorption | | | | | |
| Prior art | | | | | | | | | | | | | |
| CA-1 | | | | X | X | X | 7.9 × 10¹⁴ | 7.1 × 10hu 10 | 30/100 | X | 2.5 | 2.1 | 38.8 |
| CA-2 | | | | X | X | X | 3.9 × 10¹⁴ | 6.5 × 10¹¹ | 25/100 | X | 2.4 | 1.5 | 42.5 |

EXAMPLE 2

A phenol-modified nitrile rubber-based adhesive [777, trademark of product made by ACI (Japan) K.K., Japan] was applied to both sides of a glass epoxy board (ANSI grade, FR4, 1.5 mm thick) and cured at 170° C. for 120 minutes. This adhesive has the following composition:

| Components | Amount (g) | Trademark | manufacturer |
| --- | --- | --- | --- |
| Resin (resol type phenol resin) | 40 | SP8014 | Schenectady Chemicals, Inc. |
| Rubber (acrylonitrile butadiene)* | 60 | Nipol-1032 | Japanese Geon Co. |
| Vulcanizing agent [sulfur powders (S)] | 1.0 | | |
| Vulcanizing aid [zinc oxide (ZnO)] | 3.5 | | |
| Filler [silicon oxide (SiO₂)] | 2.0 | Aerosil 200 | Nihon Aerosil K.K. |
| Solvent | | | |
| methylisobutylketone | 150 | | |
| xylene | 150 | | |
| n-hexane | 150 | | |

*Nitrile content: 33.5%, Mooney viscosity 51

The thickness of the adhesive layer was about 28 to about 30 μm after the curing. Then, throughholes were provided at the necessary positions on the board with a drill, 0.5 mm in diameter. Then, the board was dipped in a chromic-sulfuric acid mixture (60 g/l of chromic anhydride and 220 ml/l of sulfuric acid) at 45° C. for 7 minutes to roughen the adhesive layer surface. After washing with water, the board was dipped in an aqueous sodium hydroxide solution at a concentration of 4 g/l at room temperature for 10 minutes, and then washed with water. Then, the board was dipped in an aqueous 15% hydrochloric acid solution at room temperature for 2 minutes, and then immediately in a noble metal colloidal catalyst solution containing liquid palladium and stannous chloride as dissolved (HS101B, trademark of a product made by Hitachi Kasei Kogyo K.K., Japan) at room temperature for 7 minutes. This product has a composition containing palladium chloride, stannous chloride, HCl and a surfactant. After washing with water, the board was dipped in an aqueous 3.6% hydrochloric acid solution at room temperature for 5 minutes to activate the noble metal catalyst deposited on the adhesive layer surface. After washing with water, the board was heat treated at 120° C. for 20 minutes and dried. A large number of the boards were prepared in this manner by subjecting the boards to a series of these treatments.

On the other hand, two kinds of plating resist resin compositions of ultraviolet curing type for screen printing, that is, compositions I and II shown in Table 4 were prepared. Composition I was a plating resist resin composition according to the present invention, whereas Composition II is a conventional plating resist resin composition based on the radical polymerization. In Composition I, phenol novolak type epoxy resin having a viscosity of 150 poises or more at 25° C. is a product DEN-438, trademark of Dow Chemical Co., USA, (this resin is of the type represented by the formula appearing at page 16 representing a phenyl-novolak type resin and has an epoxy equivalent of 176-181 eq/g): p-tertbutyl-phenylglycidyl ether is a product, Dinakor EX-146, trademark of Nagase Kasei Kogyo K.K., Japan represented by the following formula:

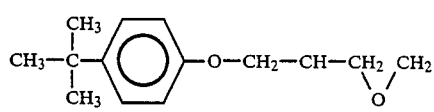

and the aromatic onium salt is a sulfonium salt of Lewis acid having the following chemical formula, made by General Electric Co., USA:

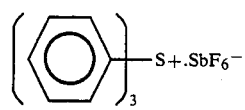

In Composition II, bisphenol A type epoxy acrylate resin is a product SP-4010, trademark of Showa Kobunshi K.K., Japan, and is a reaction product of bisphenol A type epoxy resin with acrylic acid; oligoester acrylate is a product M 8030, trademark of Toa Gosei Kagaku Kogyo K.K., Japan has the viscosity of 5-11 (P/25° C.) and is a polyfunctional polyester acrylate oligomer; and benzylketal is a product, Irgacur 651, trademark of Ciba-Geigy Corp., Switzerland, and is a benzyldimethylketyl having the following formula:

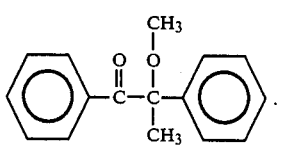

In Compositions I and II, the coloring agent Phthalocyanine Green is Cyanine Green GB, trademark of a product made by Sumika Color K.K., Japan; silicon oxide as the filler is Aerosil #300, trademark of a product made by Nihon Aerosil K.K., Japan (an ultrafine powder of $SiO_2$ and has a specific surface area of 300 $m^2/g$); zirconium silicate is Micropax SS, trademark of a product made by Hakusui Kagaku Kogyo K.K., Japan ($ZrSiO_2$ having an average particle size of 2–3 $\mu m$ and a purity of 91–93%); deforming agent silicone oil is a product KS603 made by Shinetzu Kagaku Kogyo K.K., Japan (a dimethyl silicon oil in a 65% solution in kerosene); and levelling agent acrylate ester-based copolymer is Modaflow, trademark of a product made by Monsanto Chemical Co., USA (an acrylate ester-base copolymer).

The said novel resist resin composition I of ultraviolet curing type shown in Table 4 was screen printed onto the other parts than the circuit-forming part on the adhesive layer surface having the noble metal catalyst on the boards, and cured by irradiation of a high pressure mercury lamp at 80 W/cm for 10 seconds. This treatment was carried out on both sides of the board (test piece A). Likewise, the conventional plating resist composition II was screen printed onto the other boards and cured under the same conditions as above (test piece B).

Then, three vats of the same electroless copper plating solution as in Example 1 were made ready (a, b and c).

The test piece A was placed into the vat a and the test piece B was placed into the vat b, and no test piece was placed into the vat c. Stainless steel plates were also placed into the vats a, b and c to evaluate the physical properties of deposited plating films. In each of the vats a, b and c, the plating area was set to be 150 $cm^2/l$ (in the vats a and b the plating area for the circuit-forming part of the test pieces was set to be 100 $cm^2/l$ and that for the stainless steel plate was set to be 50 $cm^2/l$, whereas in the vat c the plating area for the stainless steel plate was set to be 150 $cm^2/l$). The plating resist area on the test pieces A and B was set to be 200 $cm^2/l$ for each. The vats a, b and c were controlled to be at 70°–73° C. and plating was carried out to a plating thickness of about 30 $\mu m$ for 10 hours while supplementing the vats with the consumed components. Then, the test pieces were taken out of the vats. Then, fresh test prices A and B and fresh stainless steel plates were placed into the vats a and b, respectively, and only a fresh stainless steel plate was placed in the vat c, and subjected to the second plating operation. In this manner, the plating operation was carried out up to 10 repetitions, and a relationship between the number of repetitions of plating operation and the physical properties of the plating films deposited on the stainless steel plates was investigated. As the physical properties of the plating film, the elongation and the tensile strength of the plating films at a stretching rate of 2 mm/minute were determined by peeling the deposited plating films off from the stainless steel plates and cutting the films to dimensions of 10 mm wide and 100 mm long (25 mm for each of upper and lower chuck parts and 50 mm for the part susceptible to the measurement).

Furthermore, the printed circuit boards obtained after each plating operation were washed with water, dried at 150° C. for 30 minutes, and subjected to a heat cycle test up to 100 cycles ($\infty$), one cycle being composed of $-65°$ C. for 30 minutes to 125° C. for 30 minutes to $-65°$ C. for 30 minutes, to evaluate the reliability of throughholes by way of the number of heat cycles until the plating films deposited on the throughhole walls were cracked.

Results are shown in FIGS. 1, 2 and 3. FIG. 1 shows a relationship between the number of repetitions of plating operation and the elongation of the plating films, FIG. 2 shows a relationship between the number of repetitions of plating operation and the tensile strength of the plating films, and FIG. 3 shows a relationship between the number of repetitions of plating operation and the reliability of throughholes in the printed circuit boards.

It can be seen from these results that in the case of test piece A printed with the present plating resist resin composition I of ultraviolet curing type, the physical properties of the plating films are not deteriorated, like the plating films obtained from the stainless steel plates in the vats, even when the electroless copper plating solution is repeatedly used, and the throughholes in the printed circuit boards obtained after each of the plating operations has no influence of the repeatedly used plating solution and has a high reliability.

On the other hand, it can be seen that in the case of the conventional plating resist resin composition II of ultraviolet curing type based on the radical polymerization, the physical properties of the plating film are deteriorated at the third repetition of the plating operation, and also the reliability of the throughholes in the printed circuit boards is lowered.

Thus, as shown in this Example, repeated use of an electroless copper plating solution can be made with the present plating resist resin composition I of ultraviolet curing type and printed circuit boards with a high reliability of throughholes can be produced at the same time.

EXAMPLE 3

Another embodiment of process for producing a printed circuit board

Throughholes were provided at the necessary positions on the same insulating substrate having the same thermo-set adhesive layer as in Example 2 on both sides, and then the same plating resist resin composition I of ultraviolet curing type as in Example 2 was screen printed onto the other parts than the circuit-forming part and cured by irradiation of a high pressure mercury lamp at 80 W/cm for 10 seconds. Then, the thus obtained board was subjected to plating pretreatments in the similar manner to that of Example 2. That is, the adhesive layer surface exposed at the circuit-forming part was roughened by a chromic-sulfuric acid mixture, and then the board was washed with water, neutralized, washed with water, dipped in 15% hydrochloric acid, subjected to a noble metal colloidal catalyst treatment, washed with water, treated with 3.6% hydrochloric acid and washed with water. The thus obtained board had the noble metal catalyst also on the plating resist, and thus was subjected to such a treatment as disclosed in Japanese Patent Publications Nos. 55-30068 and 56-9024 proposed by the present inventors. That is, the board was dipped in a catalyst-removing solution composed of 100 ml/l of 36% hydrochloric acid and 0.5 g/l of ferric chloride at room temperature for 15 minutes to remove the noble metal catalyst on the plating resist. By this treatment, the noble metal catalyst deposited on the adhesive layer surface at the circuit-forming part was removed to some degree, but there still remained such an amount of the noble metal catalyst as to cause the plating reaction, because the adhesive layer surface at the circuit-forming part was roughened by the chromic-sulfuric acid mixture and thus a larger amount of the noble metal catalyst was deposited on the roughened adhesive layer surface than that on the smooth plating resist surface, and also the adherence of the nobel metal catalyst was stronger on the roughened adhesive layer surface. Then, the board was washed with water and subjected to electroless copper plating in the same manner as in Example 2 to form a circuit by depositing copper plating onto the circuit-forming part. Then, the board was washed with water and dried at 150° C. for 30 minutes to prepare a printed circuit board. In this Example, the electroless copper plating solution could be used up to 10 repetitions.

For comparison, another printed circuit board was prepared, using the same conventional plating resist resin composition II of ultraviolet curing type based on radical polymerization shown in Table 4 of Example 2, but the plating resist underwent color change at the stage of chromic-surfuric acid treatment. A circuit was formed on such board by the electroless copper plating and it was found that fine copper particles were deposited on the plating resist surface at the first repetition of plating operation and a printed circuit board with many short circuits was obtained. No further repetition of plating operation was carried out in this case.

EXAMPLE 4

Soldering heat resistance, solvent resistance and electrical insulation of the printed circuit boards obtained in Example 2 and 3 were evaluated.

Soldering heat resistance was determined by making a printed circuit board float on the surface of a solder bath at 260° C. for 60 seconds, and then visually observing the swelling of the circuit on the board and also conducting a peeling test of the plating resist 100 cross-out squares of 1 mm×1 mm by an adhesive cellophane tape. The results of peeling test of the plating resist are shown by the number of peeled cross-cut squares per 100 cross-cut squares in Table 4.

Solvent resistance was determined by dipping a printed circuit board into acetone for 30 seconds and then subjecting the board to a peeling test of plating resist in the same manner as that for the soldering heat resistance. The results are shown in Table 5 in the same manner as that for the results of the peeling test in the soldering heat resistance.

Electrical insulation was determined by measuring initial surface insulation resistance and insulation resistance after moisture absorption at 40° C. and 95% RH for 240 hours on a part, 1.0 mm in the circuit width, 1.0 mm in the circuit distance (plating resist) and 100 mm long, at DC 500 V for one minute.

The printed circuit board prepared by using the conventional plating resist resin composition of ultraviolet curing type based on radical polymerization as disclosed in Example 3 was not tested in this Example, because of the color change of the resist film and deposition of copper particles onto the resist surface.

It can be seen from the results shown in Table 5 that the printed circuit boards prepared using the present novel plating resist resin composition I of ultraviolet curing type had distinguished overall characteristics in the soldering heat resistance, solvent resistance and electrical insulation.

TABLE 4

| Component | | Resist resin composition | |
|---|---|---|---|
| | | I | II |
| Oligomer | Phenol novolak type epoxy resin | 69 | — |
| | Bisphenol A type epoxy acrylate resin | — | 35 |
| Monomer | P—tert-butylphenylglycidyl ether | 31 | — |
| | Oligoester acrylate | — | 65 |
| Photo polymerization initiator | Aromatic onium salt | 3 | — |
| | Benzylketal | — | 3 |
| Coloring agent | Phthalocyanine green | 1 | |
| Filler | Silicon oxide | 3 | |
| | Zirconium silicate | 10 | |
| Deforming agent | Silicone oil | 2 | |
| Levelling agent | Acrylate ester-based copolymer | 3 | |

TABLE 5

| | | Example | | |
|---|---|---|---|---|
| | | 1 | | 2 |
| | | Plating resist resin composition | | |
| Test item | | I | II | I |
| Solering heat resistance | Circuit swelling | None | None | None |
| | Resist peeling | 0/100 | 11/100 | 0/100 |
| Solvent resistance | Resist peeling | 0/100 | 23/100 | 0/100 |
| Electrical insulation (Surface insulation) (Ω) | Initial | $3.6 \times 10^{12}$ | $3.4 \times 10^{12}$ | $2.1 \times 10^{13}$ |
| | After moisture absorption | $2.1 \times 10^{11}$ | $4.8 \times 10^{11}$ | $4.4 \times 10^{12}$ |

As described above, the resist film prepared from the present photo-curable resist resin composition for electroless plating has much distinguished resist properties required for a printed circuit board to be prepared according to full additive procedure, such as plating solution resistance, tendency to contaminate the plaging solution, etc. and also has much distinguished printing characteristics, e.g. blurring, resolving power, etc., as shown in Table 3 in comparison with the conventional photo-curable resist resin compositions. Particularly since the present resist film has no tendency to contaminate the plating solution, the electroless plating solution can be used repeatedly, as shown in FIGS. 1 and 2, and also a printed circuit board of high throughhole reliability can be effectively obtained.

Furthermore, the curing time can be largely shortened with the present photo-curable resist resin composition for electroless plating, as compared with the conventional resist resin composition of heat curing type.

Thus, the present invention has an industrial significance of producing printed circuit boards of high reliability by full additive procedure stably at a low cost and on a mass production scale.

In the foregoing Examples, only the modes of using the present photo-curable resist resin compositions for electroless plating as screen printing ink have been shown, but the present resist resin composition can be used in various ink forms for photoresist, solder resist, various protective paints, off-set and rotary printing, etc. by utilizing its resistance to chemicals, electrical insulation, soldering heat resistance, etc. and adjusting the viscosity, etc.

The present invention thus provides a photo-curable resist resin composition for electroless plating capable of rationalizing the steps of producing a printed circuit board according to full additive procedure and thus has a very great industrial significance.

What is claimed is:

1. A process for preparing a printed circuit board, where a circuit is formed by electroless plating a circuit-forming part having at least a noble metal catalyst reactive to deposition of electroless plating on an adhesive layer surface provided on the insulating substrate, the other parts than the circuit-forming part being coated with a plating resist, which comprises forming the plating resist with a photo-curable resist resin composition for electroless plating, which comprises:

an epoxy resin having a viscosity of at least 150 poises at 25° C., and at least two glycidyl ether groups in one molecule, the glycidyl ether groups being directly bonded to the aromatic ring, as Component A, an oxirane ring-containing compound having a boiling point of at least 140° C. and a molecular weight of not more than 500 as Component B, and a photo-sensitive aromatic onium salt as Component C, wherein the Component A is in an amount of 90 to 40 parts by weight per total 100 parts by weight of the Components A and B, and the component C is in an amount of 0.1 to 5 parts by weight per total 100 parts by weight of the Components A and B, and, if any, other resin components.

2. A process for preparing a printed circuit board, which comprises chemically roughening a heat-curable adhesive provided on an insulating substrate, depositing a catalyst as an initiator for electroless plating reaction on the entire surface of the chemically roughened adhesive, screen-printing a photo-curable resist ink composition for electroless plating comprising:

(1) 40 to 90 parts by weight of at least one of bisphenol A type epoxy resins, bisphenol F type epoxy resins, novolak type epoxy resin and hydrogenated bisphenol A glycidyl ether resin, the epoxy resins having a viscosity of at least 150 poises at 25° C. and at least two glycidyl ether groups in one molecule, the glycidyl ether groups being directly bonded to the aromatic ring, as Component A;

(2) 60 to 10 parts by weight of at least one oxirane ring-containing compound having a boiling point of 140° C. or more and a molecular weight of not more than 500 selected from epoxy monomers, bisphenol A type epoxy resin, bisphenol F type epoxy resin, novolak type epoxy resin and hydrogenated bisphenol A type epoxy resin as Component B serving as a reactive diluent for Component A, total amount of said Components A and B being 100 parts by weight;

(3) 0.1 to 5 parts by weight per total weight of said Components A and B of a photosensitive aromatic onium salt selected from triphenylphenacylphosphonium tetrafluoroborate, triphenylsulfonium hexafluoroantimonate and diphenyliodonium tetrafluoroborate as Component C serving as a curing agent for said Components A and B;

(4) 1 to 25 parts by weight per 100 parts by total weight of said Components A, B an C of at least one inorganic filler selected from zirconium silicate, talc and quartz as Component D;

(5) 0.5 to 4 parts by weight per total 100 parts by weight of said Component A, B an C of silicone oil as Component E serving as a defoaming agent;

(6) 0.5 to 5 parts by weight per total 100 parts by weight of said Components A, B and C of at least one leveling agent selected from fluorine-based surfactants, silicone-based surfactants, silicone-modified epoxy resin and non-aqueous acrylic co-polymers as Component F serving as a levelling agent; and (7) 0.5 to 5 parts by weight per total 100 parts by weight of said Components A, B and C of a coloring agent selected from clay and barium sulfate as extender pigments, titanium oxide and carbon black as inorganic pigments, titanium oxide and carbon black as inorganic pigments and phthalocyanine blue and phthalocyanine green as organic pigments as Component G after drying the catalyst, curing the resist resin composition with infra-red rays, a nd dipping the resulting substrate into an electroless plating solution, thereby depositing a plating film on circuit-destined parts on the substrate and forming a circuit.

3. A process for preparing a printed circuit board, which comprises screen printing a photo-curable resist ink composition for electroless plating comprising:

(1) 40 to 90 parts by weight of at least one of bisphenol A type epoxy resins, bisphenol F type epoxy resins, novolak type epoxy resin and hydrogenated bisphenol A glycidyl ether resin, the epoxy resins having a viscosity of at least 150 poises at 25° C. and at least two glycidyl ether groups in one molecule, the glycidyl ether groups being directly bonded to the aromatic ring, as Component A;

(2) 60 to 10 parts by weight of at least one oxirane ring-containing compound having a boiling point of 140° C. or more and a molecular weight of not more than 500 selected from epoxy monomers, bisphenol A type epoxy resin, bisphenol F type epoxy resin, novolak type epoxy resin and hydrogenated bisphenol A type epoxy resin as Component B serving as a reactive diluent for Component A, total amount of said Components A and B being 100 parts by weight;

(3) 0.1 to 5 parts by weight per total weight of said Components A and B of a photosensitive aromatic onium salt selected from triphenylphenacylphosphonium tetrafluoroborate, triphenylsulfonium hexafluoroantimonate and diphenyliodonium tetrafluoroborate as Component C serving as a curing agent for said Components A and B;

(4) 1 to 25 parts by weight per 100 parts by total weight of said Components A, B an C of at least one inorganic filler selected from zirconium silicate, talc and quarts as Component D;

(5) 0.5 to 4 parts by weight per total 100 parts by weight of said Component A, B an C of silicone oil as Component E serving as a defoaming agent;

(6) 0.5 to 5 parts by weight per total 100 parts by weight of said Components A, B and C of at least one leveling agent selected from fluorine-based surfactants, silicone-based surfactants, silicone-modified epoxy resin and non-aqueous acrylic co-polymers as Component F serving as a levelling agent; and (7) 0.5 to 5 parts by weight per total 100 parts by weight of said Components A, B and C of a coloring agent selected from clay and barium sulfate as extender pigments, titanium oxide and carbon black as inorganic pigments, titanium oxide and carbon black as inorganic pigments and phthalocyanine blue and phthalocyanine green as organic pigments as Component G onto other parts than circuit-destined parts on the surface of a heat-curable adhesive provided on an insulating substrate, curing the resist resin composition with ultraviolet rays, then chemically roughening the surface of the adhesive on exposed circuit-destined parts, depositing a catalyst as an initiator for electroless plating reaction on the entire surface, then removing the catalyst deposited on the surface of the resist resin composition with a catalyst-removing solution through dissolution and dipping the resulting substrate into an electroless plating solution, thereby depositing a plating film onto the circuit-destined part and forming a circuit.

* * * * *